(12) United States Patent
Liu et al.

(10) Patent No.: US 11,580,903 B2
(45) Date of Patent: Feb. 14, 2023

(54) DISPLAY PANEL, AND DISPLAY APPARATUS AND CONTROL METHOD THEREOF

(71) Applicants: BEIJING BOE DISPLAY TECHNOLOGY CO., LTD., Beijing (CN); BOE TECHNOLOGY GROUP CO., LTD., Beijing (CN)

(72) Inventors: Sha Liu, Beijing (CN); Yalong Su, Beijing (CN); Wenting Tian, Beijing (CN); Xiao Sun, Beijing (CN); Yun Qiu, Beijing (CN); Qiang Zhang, Beijing (CN); Zhaokun Yang, Beijing (CN); Pingqi Zhang, Beijing (CN); Yingji Jiang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 113 days.

(21) Appl. No.: 17/256,720

(22) PCT Filed: Apr. 8, 2020

(86) PCT No.: PCT/CN2020/083692
§ 371 (c)(1),
(2) Date: Dec. 29, 2020

(87) PCT Pub. No.: WO2020/207402
PCT Pub. Date: Oct. 15, 2020

(65) Prior Publication Data
US 2021/0256905 A1    Aug. 19, 2021

(30) Foreign Application Priority Data
Apr. 10, 2019  (CN) .......................... 201910285673.9

(51) Int. Cl.
*G09G 3/30*     (2006.01)
*G09G 3/36*     (2006.01)
(Continued)

(52) U.S. Cl.
CPC ..... *G09G 3/3225* (2013.01); *G02F 1/134318* (2021.01); *H01Q 1/24* (2013.01);
(Continued)

(58) Field of Classification Search
CPC ........ G09G 3/3225; G09G 2370/00–23; G02F 1/134318
See application file for complete search history.

(56) References Cited

U.S. PATENT DOCUMENTS

2002/0152606 A1   10/2002  Huang et al.
2004/0189625 A1*   9/2004  Sato ................ G06K 19/07749
                                                       345/204
(Continued)

FOREIGN PATENT DOCUMENTS

CN    101308266 A    11/2008
CN    101431344 A     5/2009
(Continued)

OTHER PUBLICATIONS

First office action of Chinese application No. 201910285673.9 dated Aug. 7, 2020.
(Continued)

*Primary Examiner* — Sanghyuk Park
(74) *Attorney, Agent, or Firm* — Fay Sharpe LLP

(57) ABSTRACT

The present application provides a display panel, belonging to the field of display technology. The display panel includes a base substrate, and a first electro-conductive pattern and a second electro-conductive pattern which are arranged on the base substrate, wherein the first electro-conductive pattern includes a first electrode layer, the second electro-conduc-
(Continued)

tive pattern includes a second electrode layer, at least one of the first electro-conductive pattern and the second electro-conductive pattern further includes an antenna pattern, and the antenna pattern is insulated from the electrode layer in the electro-conductive pattern where the antenna pattern is located.

18 Claims, 7 Drawing Sheets

(51) Int. Cl.
G09G 3/3225 (2016.01)
G02F 1/1343 (2006.01)
H01Q 1/24 (2006.01)
H01Q 9/06 (2006.01)
H01L 27/32 (2006.01)

(52) U.S. Cl.
CPC .......... *H01Q 9/06* (2013.01); *G09G 2370/16* (2013.01); *H01L 27/3225* (2013.01)

(56) References Cited

U.S. PATENT DOCUMENTS

| 2010/0182207 A1 | 7/2010 | Miyata et al. |
| 2014/0125533 A1 | 5/2014 | Shi et al. |
| 2014/0138546 A1 | 5/2014 | Iluz et al. |
| 2015/0029064 A1* | 1/2015 | Pan ...................... H01Q 13/106 343/769 |
| 2015/0220184 A1 | 8/2015 | Park et al. |
| 2016/0329363 A1 | 11/2016 | He et al. |
| 2016/0357306 A1* | 12/2016 | Zou ...................... G02F 1/13338 |
| 2017/0179168 A1* | 6/2017 | Suzuki ...................... H01Q 1/36 |
| 2018/0287254 A1* | 10/2018 | Nakano ................. H01Q 25/001 |
| 2019/0179195 A1 | 6/2019 | Zhang et al. |
| 2019/0363452 A1 | 11/2019 | Ting et al. |

FOREIGN PATENT DOCUMENTS

| CN | 101682111 A | 3/2010 |
| CN | 102931199 A | 2/2013 |
| CN | 103635419 A | 3/2014 |
| CN | 104485334 A | 4/2015 |
| CN | 106842672 A | 6/2017 |
| CN | 108615966 A | 10/2018 |
| CN | 208384288 U | 1/2019 |
| CN | 109950294 A | 6/2019 |

OTHER PUBLICATIONS

Second office action of Chinese application No. 201910285673.9 dated Nov. 30, 2020.
Notification to grant patent right for invention of Chinese application No. 201910285673.9 dated Apr. 27, 2021.

\* cited by examiner

DISPLAY PANEL, AND DISPLAY APPARATUS AND CONTROL METHOD THEREOF

CROSS-REFERENCE TO RELATED APPLICATIONS

The present application is a 371 of PCT Patent Application Serial No. PCT/CN2020/083692, filed on Apr. 8, 2020, which claims priority to Chinese Patent Application No. 201910285673.9 filed on Apr. 10, 2019 and entitled "DISPLAY PANEL AND DISPLAY DEVICE", the entire contents of which are incorporated herein by reference.

TECHNICAL FIELD

The present application relates to the field of display technology, and particularly, relates to a display panel, a display apparatus and a control method thereof.

BACKGROUND

Currently, most display apparatuses have the function of communication, and the structure thereof includes a display panel, an antenna and a shell.

During the process of manufacturing a display apparatus, it is possible to adopt the technology of Laser-Direct-Structuring (LDS) to form an antenna. Exemplarily, a three-dimensional plastic bracket containing an organic metal compound can be firstly formed on the manufactured shell, and then a laser is irradiated to the three-dimensional plastic bracket, so that the three-dimensional plastic bracket decomposes into metal particles under the action of the laser to form an antenna pattern.

SUMMARY

The present application provides a display panel, a display apparatus and a control method thereof.

In one aspect, a display panel is provided, including: a base substrate, and a first electro-conductive pattern and a second electro-conductive pattern which are arranged on the base substrate and insulated from each other;

wherein the first electro-conductive pattern and the second electro-conductive pattern each includes an electrode layer, at least one of the first electro-conductive pattern and the second electro-conductive pattern includes an antenna pattern, and the antenna pattern is insulated from the electrode layer in the electro-conductive pattern where the antenna pattern is located.

Optionally, the base substrate has a display area, wherein the antenna pattern is located within the display area.

Optionally, the base substrate has a non-display area, wherein the antenna pattern is located within the non-display area.

Optionally, an orthographic projection of each of the antenna patterns on the base substrate presents a shape having edges of at least two different lengths.

Optionally, a length of each of the edges is a quarter of the wavelength of a signal to be transmitted.

Optionally, the electrode layer in the electro-conductive pattern where the antenna pattern is located is a plate layer having a hollowed-out area, wherein the antenna pattern is located in the hollowed-out area.

Optionally, the display panel is an organic light emitting diode (OLED) display panel, and the electrode layer in the electro-conductive pattern where the antenna pattern is located is a cathode layer.

Optionally, the display panel is a liquid crystal display (LCD) panel, and the electrode layer in the electro-conductive pattern where the antenna pattern is located is a common electrode layer.

Optionally, the material of the antenna pattern includes a transparent electro-conductive material.

Optionally, the electro-conductive pattern where the antenna pattern is located is formed by a one-time patterning process.

Optionally, the base substrate has a non-display area, and the antenna pattern is located within the non-display area;

an orthographic projection of each antenna pattern on the base substrate presents a shape having edges of at least two different lengths, and a length of each of the edges is a quarter of the wavelength of a signal to be transmitted;

the electrode layer in the electro-conductive pattern where the antenna pattern is located is a plate layer having a hollowed-out area, wherein the antenna pattern is located in the hollowed-out area; and the display panel is an OLED display panel, and the electrode layer in the electro-conductive pattern where the antenna pattern is located is a cathode layer.

In another aspect, a display apparatus is provided, including: a control component and display panel according to the above aspect;

wherein the control component is used to provide a driving signal for the display panel to display an image through the first electrode layer and the second electrode layer; and the control component is further used to control the antenna pattern to transmit a communication signal.

Optionally, the control component is used to provide a driving signal for the display panel to display an image through the first electrode layer and the second electrode layer during a first time period, control the antenna pattern to transmit a communication signal during a second time period, and the first time period and the second time period are two different time periods within the display duration of one image frame.

Optionally, the control component includes a display control chip and a communication control chip, wherein the display control chip is electrically connected to the first electrode layer and the second electrode layer, respectively, and the communication control chip is electrically connected to the antenna pattern;

the display control chip is used to provide a driving signal for the display panel to display an image through the first electrode layer and the second electrode layer; and the communication control chip is used to control the antenna pattern to transmit a communication signal.

Optionally, the control component is electrically connected to the first electrode layer, the second electrode layer and the antenna pattern via signal lines, and the control component is used to: detect the type of received signal after receiving the signal transmitted by the signal lines, respond, when the received signal is a communication signal, to the communication signal, and respond, when the received signal is a response signal of a display control signal, to the response signal.

Optionally, the control component includes a display control chip, a communication control chip and an adapter chip, wherein the adapter chip is electrically connected to the display control chip and the communication control chip, respectively, and the adapter chip is electrically connected to the first electrode layer, the second electrode layer and the antenna pattern in the display panel via the signal lines.

In still another aspect, a control method of a display apparatus is provided. The method is applied to a control component in the display apparatus, the display apparatus including the display panel according to the above aspect, and the method including:

providing a driving signal for the display panel to display an image through the first electrode layer and the second electrode layer; and controlling the antenna pattern to transmit a communication signal.

Optionally, providing the driving signal for the display panel to display an image through the first electrode layer and the second electrode layer includes:

providing a driving signal for the display panel to display an image through the first electrode layer and the second electrode layer during a first time period;

and, controlling the antenna pattern to transmit the communication signal includes:

controlling the antenna pattern to transmit the communication signal during a second time period, the first time period and the second time period being two different time periods within the display duration of one image frame.

Optionally, the control component includes a display control chip and a communication control chip, wherein the display control chip is electrically connected to the first electrode layer and the second electrode layer, respectively, the communication control chip is electrically connected to the antenna pattern, and providing the driving signal for the display panel to display an image through the first electrode layer and the second electrode layer includes:

controlling, by the display control chip, the first electrode layer and the second electrode layer to provide a driving signal for the display panel to display an image; and controlling, by the communication control chip, the antenna pattern to transmit a communication signal.

Optionally, the control component is electrically connected to the first electrode layer, the second electrode layer and the antenna pattern via signal lines, and the method further includes:

detecting the type of the received signal after receiving the signal transmitted by the signal lines;

responding, when the received signal is a communication signal, to the communication signal; and responding, when the received signal is a response signal of a display control signal, to the response signal.

DESCRIPTION OF EMBODIMENTS

The present application is described in detail below in combination with the accompanying drawings. Apparently, the described embodiments are merely some embodiments, rather than all embodiments, of the present application. Based on the embodiments of the present application, all other embodiments derived by a person of ordinary skill in the art without creative efforts shall fall within the protection scope of the present application.

The display apparatus has been more and more widely applied, and the LDS technology is usually adopted to manufacture an antenna in the display apparatus. However, it takes much time to form an antenna by adopting the LDS technology, resulting in a low manufacturing efficiency of the display apparatus.

The present application provides a display panel which, during the process of manufacturing the display panel, enables an electrode layer and an antenna to be manufactured in the same layer so as to avoid taking much time to form an antenna due to adopting the LDS technology, thereby improving the manufacturing efficiency of the display apparatus.

Figure 1:
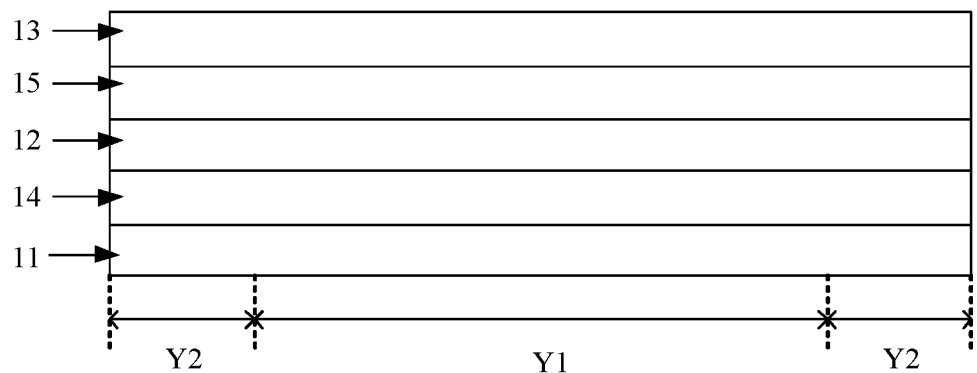
FIG. 1 is a structural diagram of a display panel according to an embodiment of the present application.

FIG. 1 is a structural diagram of a display panel according to an embodiment of the present application, the display panel 10 may include: a base substrate 11 and a first electro-conductive pattern 12 and a second electro-conductive pattern 13 which are arranged on the base substrate 11 and insulated from each other. The first electro-conductive pattern 12 includes a first electrode layer, the second electro-conductive pattern 13 includes a second electrode layer, at least one of the first electro-conductive pattern 12 and the second electro-conductive pattern 13 further includes an antenna pattern, and the antenna pattern is insulated from the electrode layer in the electro-conductive pattern where the antenna pattern is located. The first electrode layer and the second electrode layer are used to provide a driving signal for the display panel to display an image, and the antenna pattern is used to transmit a communication signal.

In summary, in the display panel according to an embodiment of the present application, at least one of the first electro-conductive pattern and the second electro-conductive pattern further includes an antenna pattern, therefore, during the process of manufacturing the display panel, after forming an electro-conductive material layer for manufacturing an electro-conductive pattern including an antenna pattern, it is possible to process the electro-conductive material layer through a patterning process so as to form an electro-conductive layer and an antenna pattern, without adopting the LDS technology to form an antenna pattern, which shortens the time for manufacturing the display apparatus and therefore improves the manufacturing efficiency of the display apparatus.

Still referring to FIG. 1, the display panel 10 may also include a drive layer 14 and a target layer 15, it should be noted that the target layer 15 can be an electroluminescent layer or a liquid crystal layer. When the target layer 15 is an electroluminescent layer, the display panel 10 can be an organic light emitting diode (OLED) display panel; when the target layer 15 is a liquid crystal layer, the display panel 9 can be a liquid crystal display (LCD) panel.

Optionally, the drive layer 14, the first electro-conductive pattern 12, the target layer 15 and the second electro-conductive pattern 13 can be sequentially arranged on the base substrate 11 in the direction away from the base substrate 11. Optionally, the drive layer 14 may include a plurality of thin film transistors (not shown in FIG. 1); the first electrode layer in the first electro-conductive pattern 12 may include a plurality of first electrodes (not shown in FIG. 1), and the plurality of thin film transistors correspond to the plurality of first electrodes one by one, wherein a drain electrode of each thin film transistor is electrically connected to the first electrode corresponding to the thin film transistor.

When the display panel is an OLED display panel, the first electrode layer in the first electro-conductive pattern 12 can be an anode layer, and the first electrode included therein can be an anode. The second electrode layer in the second electro-conductive pattern 13 can be a cathode layer and the cathode layer can be either a structure of whole layer or, of course, a structure of non-whole layer, including a plurality of cathodes. When the display panel is a LCD panel, the first electrode layer in the first electro-conductive pattern 12 can be a pixel electrode layer, and the first electrode included therein can be a pixel electrode. The second electrode layer in the second electro-conductive pattern 13 can be a common electrode layer, and the common electrode layer can be either a structure of whole layer or, of course, a structure of non-whole layer, including a plurality of common electrodes.

FIG. 1 is described merely by taking the case that the first electro-conductive pattern 12 and the second electro-conductive pattern 13 are located on the two sides of the target layer 15, and arranged oppositely as an example. Optionally, when the display panel 10 is a LCD panel, the first electro-conductive pattern 12 and the second electro-conductive pattern 13 can also be located on the same side of the target layer 15, and the first electro-conductive pattern 12 and the second electro-conductive pattern 13 can also be arranged in the same layer, which will not be limited in the present application.

Figure 2:
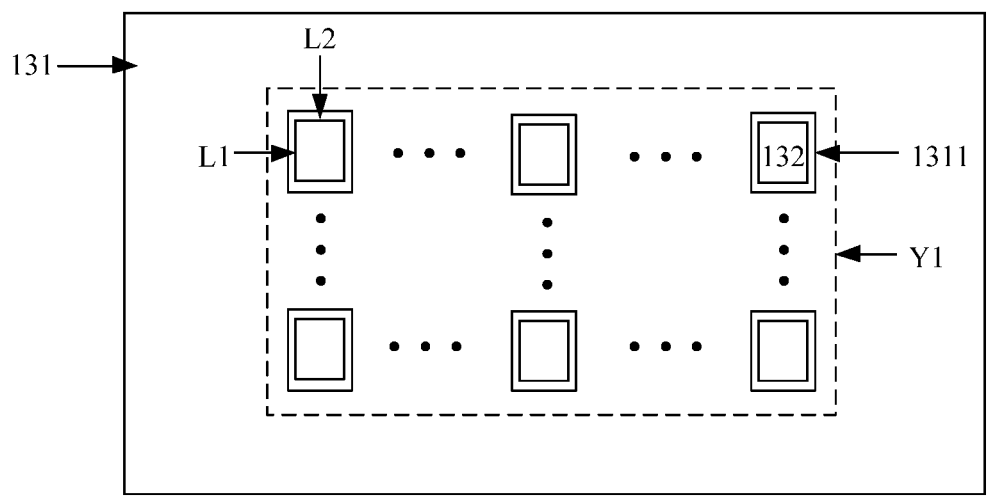
FIG. 2 is a structural diagram of a second electro-conductive pattern according to an embodiment of the present application.

Still referring to FIG. 1, the base substrate 11 has a display area Y1 and a non-display area Y2, and an orthographic projection of the antenna pattern on the base substrate 11 can have a plurality of positional relationships with the display area Y1 and non-display area Y2. Two positional relationships of the plurality of positional relationships will be described below:

In the first positional relationship, in conjunction with FIGS. 1 and 2, FIG. 2 is a top-view structural diagram of a second electro-conductive pattern according to an embodiment of the present application. The second electro-conductive pattern 13 may include a second electrode layer 131 and an antenna pattern 132, and each of the antenna patterns 132 is located within the display area Y1. Under such a structure, there is no need for the antenna pattern 132 to be set within the non-display area Y2, and the width of the non-display area Y2 can be set smaller, so that the bezel of the display panel can be set narrower to achieve a narrow bezel of the display apparatus.

Figure 3:
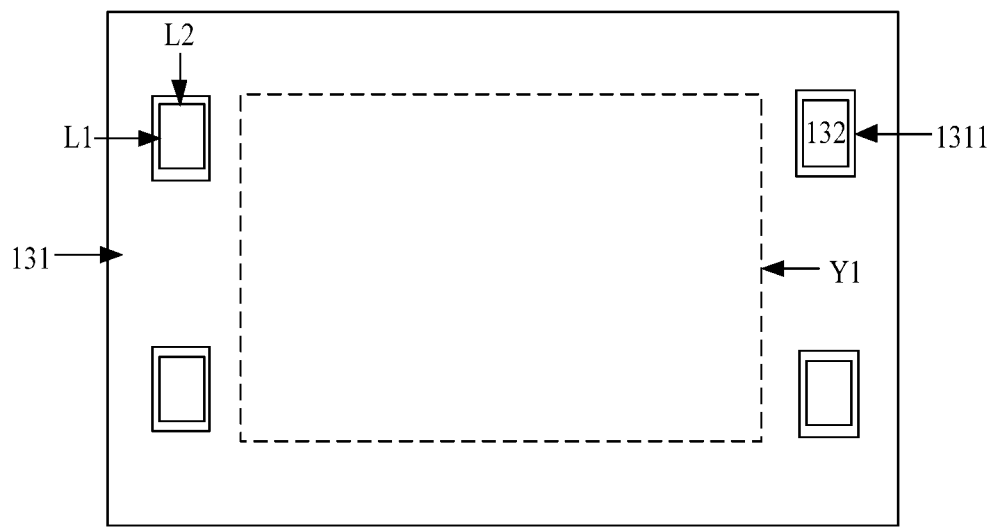
FIG. 3 is a structural diagram of another second electro-conductive pattern according to an embodiment of the present application.

In the second positional relationship, in conjunction with FIGS. 1 and 3, FIG. 3 is a top-view structural diagram of another second electro-conductive pattern according to an embodiment of the present application. The second electro-conductive pattern 13 may include a second electrode layer 131 and an antenna pattern 132, and the antenna pattern 132 is located within the non-display area Y2. Under such a structure, it is possible to avoid the influence on the display effect of the display panel 10 when the antenna pattern 132 is set within the display area Y1.

Optionally, the electrode layer in the electro-conductive pattern where the antenna pattern is located is a plate layer having a hollowed-out area. The antenna pattern is located in the hollowed-out area. Exemplarily, in conjunction with FIGS. 1 and 3, the second electrode layer 131 in the second electro-conductive pattern 13 presents a shape of plate. The second electro-conductive pattern 13 includes at least one antenna pattern 132. The second electrode layer 131 has at least one hollowed-out area 1311, and the at least one antenna pattern 132 is correspondingly located one by one within the at least one hollowed-out area 1311. Each of FIG. 2 and FIG. 3 illustrates a plurality of antenna patterns 132, and FIG. 3 illustrates four antenna patterns 132. Optionally, the second electro-conductive pattern 13 may further include other number (e.g., six) of antenna patterns, which will not be limited in the present application.

FIGS. 2 and 3 are described merely by taking the case that the electro-conductive pattern where the antenna pattern 132 is located is the second electro-conductive pattern 13, i.e., that the electrode layer in the electro-conductive pattern is a cathode layer (when the display panel is an OLED display panel) or that a common electrode layer (when the display panel is a LCD panel) as an example. Optionally, the electro-conductive pattern where the antenna pattern is located can be a first electro-conductive pattern 12. That is, the electrode layer in the electro-conductive pattern can be an anode layer (when the display panel is an OLED display panel) or a pixel electrode layer (when the display panel is a liquid crystal display panel). Alternatively, the electro-conductive pattern where the antenna pattern is located can be a first electro-conductive pattern 12 and a second electro-conductive pattern 13. That is, both the anode layer and the cathode layer are arranged with antenna patterns in the same layer, or the pixel electrode layer and the common electrode layer are both arranged with antenna patterns in the same layer, which will not be limited in the present application.

In addition, when the electro-conductive pattern where the antenna pattern is located is a first electro-conductive pattern 12, the shape and size of the area where the antenna pattern is located can be the same as those of the area where at least one first electrode in the first electrode layer is located. That is, when the electrode layer in the electro-conductive pattern is a anode layer, the shape and size of the area where the antenna pattern is located can be the same as those of the area where at least one anode in the anode layer is located, or when the electrode layer in the electro-conductive pattern is a pixel electrode layer, the shape and size of the area where the antenna pattern is located can be the same as those of the area where the at least one pixel electrode is located.

When the antenna pattern is located within the display area, and the shape and size of the area where the antenna pattern is located is the same as those of the area where each first electrode is located, the resolution of the display panel in the area where the antenna pattern is located is equal to that of other areas; when the shape and size of the area where the antenna pattern is located is the same as those of the area where a plurality of first electrodes are located, the resolution of the display panel in the area where the antenna pattern is located is lower than that of other areas.

The antenna pattern can transmit a communication signal by receiving or transmitting (hereinafter referred to as "transceiving") an electromagnetic wave. The number of wavelength types of electromagnetic waves that the antenna pattern can transceive is positively related to the number of types of edge lengths had by the shape presented by the orthographic projection of the antenna pattern on the base substrate, and the antenna pattern can transceive an electromagnetic wave signal via its edges. In addition, when an orthographic projection of the antenna pattern on the base substrate presents a shape having edges of n lengths, and the antenna pattern can transceive an electromagnetic wave of at least n wavelengths. Exemplarily, when the second electro-conductive pattern includes a plurality of antenna patterns, the plurality of antenna patterns includes an antenna pattern that can transceive one or more of signals such as wireless local area network (LAN) signals, wireless wide area network signals, Bluetooth signals, call signals and etc.

Optionally, an orthographic projection of each antenna patterns on the base substrate presents a shape having edges of at least two different lengths. Exemplarily, in conjunction with FIGS. 1 to 3, a shape presented by an orthographic projection of each antenna pattern 132 on the base substrate 11 can have a first edge L1 of a first length, and a second edge L2 of a second length, wherein the first length can be greater than the second length. Under such a structure, each antenna pattern 132 can transceive an electromagnetic wave of at least two wavelengths, which improves the performance of the antenna pattern 132 for transceiving an electromagnetic wave.

Optionally, a length of each edge of a shape presented by an orthographic projection of each antenna pattern on the base substrate is a quarter of the wavelength of one signal to be transmitted. The signal to be transmitted can be an electromagnetic wave. Exemplarily, when the wavelength of the signal to be transmitted is 480 mm, the length of the first edge L1 of at least one antenna pattern 132 in the second electro-conductive pattern 13 can be 120 mm. When the wavelength of another signal to be transmitted is 240 mm, the length of the second edge L2 of at least one antenna pattern 132 in the second electro-conductive pattern 13 can be 60 mm. Under such a structure, since the antenna pattern has a higher conversion efficiency (i.e., the ratio of the power of the signal emitted in the antenna pattern to that of the signal input to the antenna pattern) for the signal to be transmitted whose wavelength is a quarter of its edge length, that is, when emitting the signal to be transmitted via the antenna pattern, the power of the signal necessarily input to the antenna pattern is lower, therefore, the antenna pattern can have the effect of saving electrical energy.

Optionally, when a plurality of antenna patterns 132 are included in the second electro-conductive pattern 13, the size of each of the plurality of antenna patterns 132 can be the same, or, the plurality of antenna patterns 132 includes antenna patterns 132 of at least two different sizes. When the plurality of antenna patterns 132 includes antenna patterns 132 of at least two different sizes, the plurality of antenna patterns 132 can transceive an electromagnetic wave of more wavelengths, which further improves the performance of the antenna pattern 132 for transceiving an electromagnetic wave.

FIGS. 2 and 3 are described merely by taking the case that the shape of each antenna pattern 132 in the second electro-conductive pattern 13 is a rectangle as an example. Optionally, the second electro-conductive pattern 13 may also include antenna patterns 132 of other shapes (such as at least one of triangle, polygon, trapezoid or irregular shapes), which will not be limited in the present application.

Optionally, the material of the antenna pattern 132 can be a transparent electro-conductive material (e.g., indium tin oxide (ITO) or zinc oxide (ZnO), etc.) or a non-transparent electro-conductive material (e.g., copper or silver, etc.).

Optionally, $3D1 \geq D2 \geq 2D1$, wherein, D1 is a skin depth of the antenna pattern 132, D2 is a thickness of the antenna pattern 132, and the thickness direction of the antenna pattern 132 is perpendicular to the plane where the base substrate is located. Exemplarily, when the skin depth of the antenna pattern 132 is 1.36 micron, the thickness of the antenna pattern 132 can range from 2.72 micron to 4.08 micron.

When there is an alternating current or alternating electromagnetic field in the antenna pattern, the current flows through a thin layer close to the surface of the antenna pattern. That is, the current concentrates on the "skin" part of the antenna pattern. The thickness of the thin layer is the skin depth of the antenna pattern, and the skin depth of the antenna pattern can be obtained by a preset formula $$\Delta = \sqrt{\frac{2}{\omega \mu \nu}},$$

wherein $\Delta$ is the skin depth of the antenna pattern, $\omega$ is the angular frequency of the antenna pattern, $\mu$ is the magnetic permeability of the antenna pattern and $\nu$ is the electrical conductivity of the antenna pattern.

Figure 4:
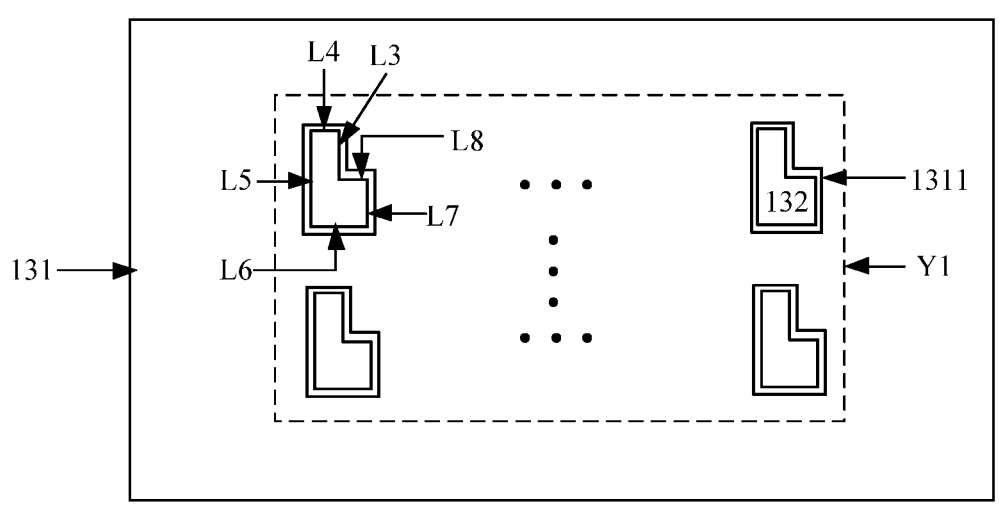
FIG. 4 is a structural diagram of a further second electro-conductive pattern according to an embodiment of the present application.

FIG. 4 is a structural diagram of a further second electro-conductive pattern according to an embodiment of the present application. The second electro-conductive pattern 13 may include a second electrode layer 131 having a plurality of hollowed-outs areas 1311 and a plurality of antenna patterns 132 correspondingly located one by one within the plurality of hollowed-out areas 1311, and the plurality of antenna patterns 132 are located within the display area Y1. An orthographic projection of each antenna pattern 132 on the substrate presents a shape having edges of six lengths, for example, a third edge L3, a fourth edge L4, a fifth edge L5, a sixth edge L6, a seventh edge L7 and an eighth edge L8. The antenna patterns 132 can emit an electromagnetic wave of at least six wavelengths, and the antenna patterns 132 can transceive an electromagnetic wave via the third edge L3, the fifth edge L5 and the sixth edge L6.

In conjunction of FIGS. 2 and 4, when a plurality of antenna patterns 132 located in the display area are included in the second electro-conductive pattern 13, the plurality of antenna patterns 132 can be arranged in an array within the display area Y1.

FIGS. 2 and 4 are described merely by taking the case that the plurality of antenna patterns 132 is arranged in an array within the display area Y1 as an example. Optionally, as shown in FIG. 5, a plurality of (FIG. 5 is described merely by taking four antenna patterns as an example) antenna patterns 132 can further be arranged in a concentrated array within the display area Y1, which will not be limited in the present application.

Figure 5:
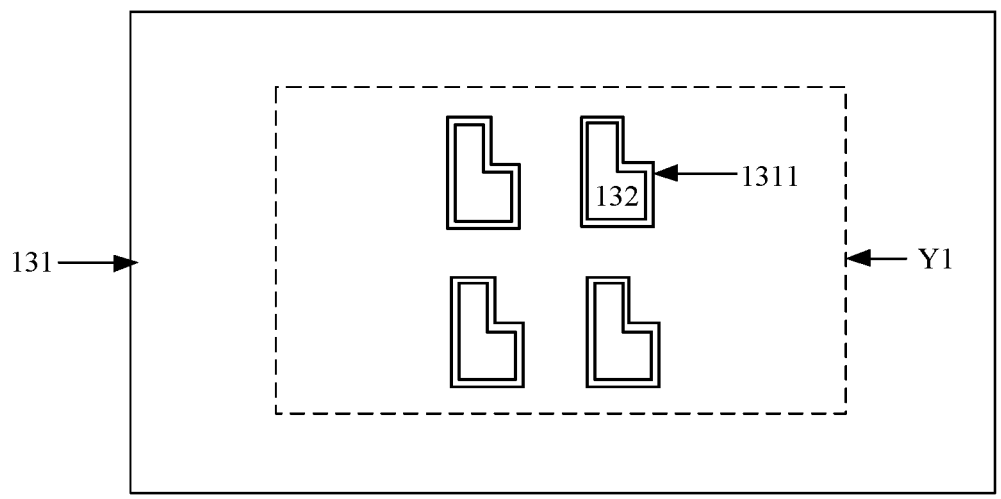
FIG. 5 is a structural diagram of still another second electro-conductive pattern according to an embodiment of the present application.
Figure 6:
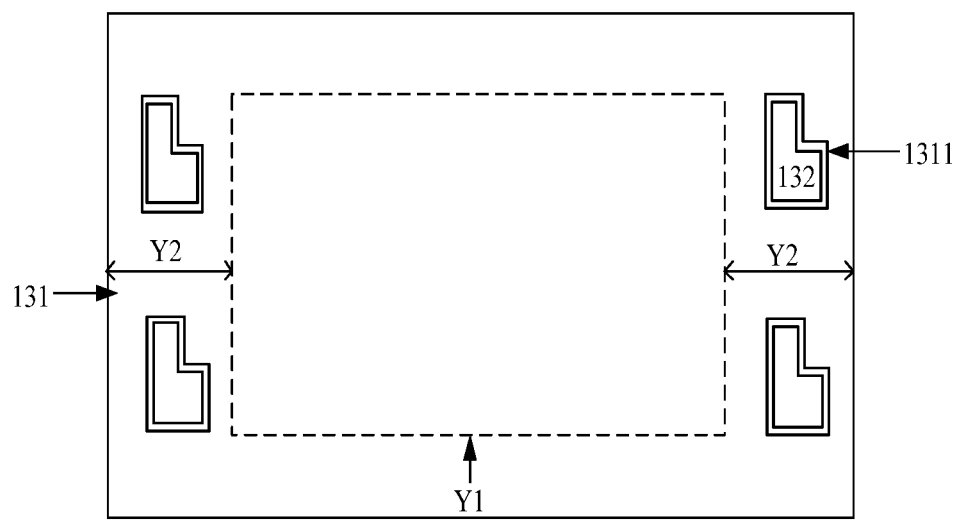
FIG. 6 is a structural diagram of yet still another second electro-conductive pattern according to an embodiment of the present application.

In addition, FIGS. 4 and 5 are described merely by taking the case that an antenna pattern 132 having six edges is located within the display area Y1, optionally, as shown in FIG. 6, the antenna pattern 132 having six edges can also be located outside the display area Y2, which will not be limited in the present application.

When the display panel 10 is an OLED display panel, the display panel 10 is either a color light OLED display panel or a white light OLED display panel.

Figure 7:
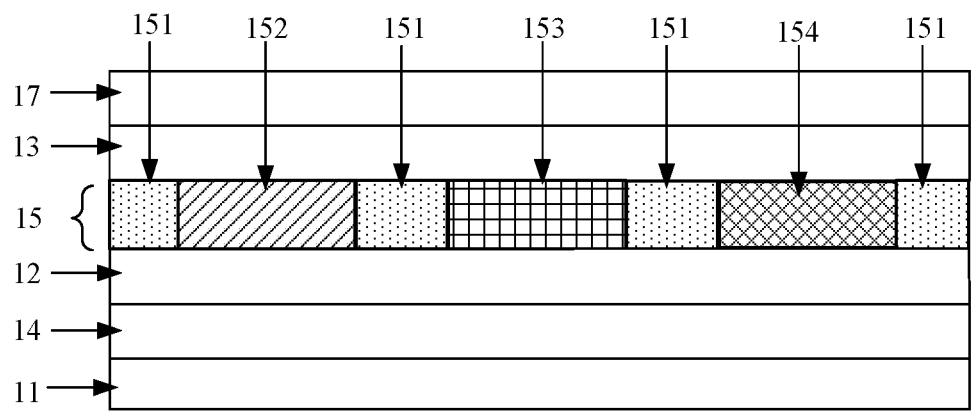
FIG. 7 is a structural diagram of another display panel according to an embodiment of the present application.

Exemplarily, as shown in FIG. 7, FIG. 7 is a cross-section (the section can be a surface perpendicular to the thickness direction of the display surface) structural diagram of a display panel according to an embodiment of the present application. When the display panel 10 can be a color light OLED display panel, the target layer 15 in the color light OLED display panel may include a plurality of OLEDs and a pixel definition layer 151, wherein the pixel definition layer 151 is used to isolate any two adjacent OLEDs from each other in the target layer 15. The plurality of OLEDs corresponds to a plurality of first electrodes of the first electrode layer in the first electro-conductive pattern 12 one by one, and each first electrode can be used to apply an anode voltage to its corresponding OLED. Optionally, the plurality of OLEDs may include at least one (only one is shown in FIG. 7) red light OLED 152, at least one (only one is shown in FIG. 7) blue light OLED 153 and at least one (only one is shown in FIG. 7) green light OLED 154. During the process of manufacturing the display panel 10, it is possible to manufacture the first electro-conductive pattern 12, the target layer 15 and the second electro-conductive pattern 13 in the display panel 10 via the processes of evaporation and plating. FIG. 7 illustrates a structural diagram of some pixel in a display panel according to an embodiment of the present application, the structures of other pixels in the display panel can be referred to FIG. 7, which will not be limited in the present application.

Figure 8:
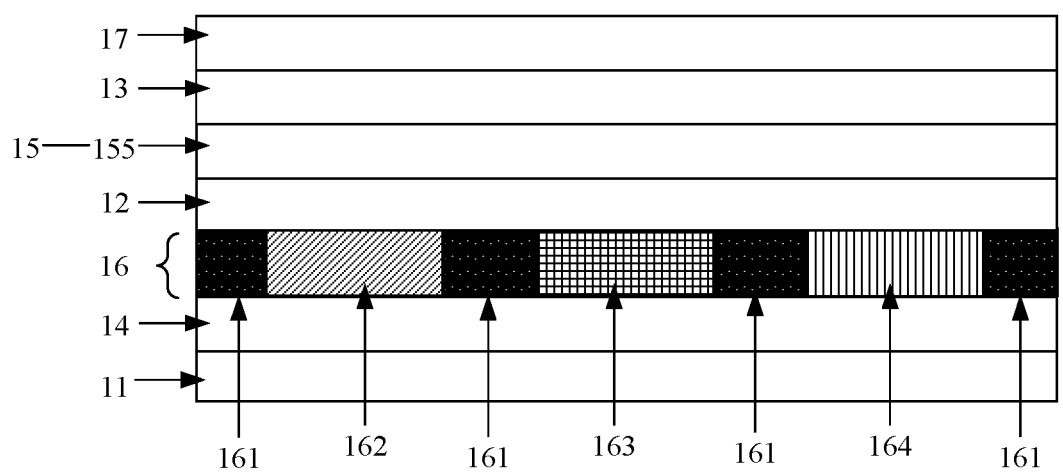
FIG. 8 is a structural diagram of a further display panel according to an embodiment of the present application.

As shown in FIG. 8, FIG. 8 is a cross-section (the section can be a surface perpendicular to the thickness direction of the display surface) structural diagram of a display panel according to an embodiment of the present application. When the display panel 10 is a white light OLED display panel, the target layer 15 in the white light OLED display panel may include a white light OLED 155, wherein the white light OLED 155 may also include a color-resisting layer 16. Optionally, the color-resisting layer 16 can be located between a drive layer 14 and a first electro-conductive pattern 12. Optionally, the color-resisting layer 16 can be also located on the side away from the target layer 15 of the second electro-conductive pattern 13, which will not be limited in the present application.

Wherein, the color-resisting layer 16 may include a plurality of color-resisting blocks and a black matrix 161, wherein the black matrix 161 is used to isolate any two adjacent color-resisting blocks from each other in the color-resisting layer 16. The plurality of color-resisting blocks corresponds to a plurality of first electrodes in the first electro-conductive pattern 12 one by one, and each first electrode is used to apply an anode voltage to the area where its corresponding color-resisting block is located.

Optionally, the plurality of color-resisting blocks may include at least one red color-resisting block 162 (only one is shown in FIG. 8), at least one (only one is shown in FIG. 8) blue color-resisting block 163 and at least one (only one is shown in FIG. 8) green color-resisting block 164. During the process of manufacturing the display panel 10, it is possible to manufacture the color-resisting layer 16 via the processes of evaporation and plating. FIG. 8 illustrates a structural diagram of some pixel in a display panel according to an embodiment of the present application, the structures of other pixels in the display panel can be referred to FIG. 8, which will not be repeated in the embodiment of the present application here.

In conjunction with FIGS. 7 and 8, the display panel 10 may also include a package substrate 17, wherein the package substrate 17 can be located on the side away from the target layer 15 of the second electro-conductive pattern 13.

When the display panel 10 is an OLED display panel, for different types of OLED display panels, the base substrate and each film layer of the OLED display panel can be arranged in different ways in the case of no blocking the light emission of the OLED display panel.

For example, when the type of the OLED display panel is a top-emission light type (that is, the OLED emits light from a side away from the base substrate 11), and the OLED display panel is the display panel as shown in FIG. 7, the second electro-conductive pattern 13 and the packaging substrate 17 are both transparent (the transparency may not be an absolute transparency, but refers to a high light transmittance), the base substrate 11, the drive layer 14 and the first electro-conductive pattern 12 can be either transparent or not transparent. When the OLED display panel is the display panel as shown in FIG. 8, the first electro-conductive pattern 12, the second electro-conductive pattern 13 and the packaging substrate 17 are all transparent, and the base substrate 11 and the drive layer 14 can be either transparent or not transparent.

When the type of the OLED display panel is a bottom-emission type (that is, the OLED emits light from a side where the base substrate 11 is located), the base substrate 11, the drive layer 14 and the first electro-conductive pattern 12 are all transparent, the second electro-conductive pattern 13 and the packaging substrate 17 can be either transparent or not transparent.

When the type of the OLED display panel is a double-side emission type (that is, the OLED emits light from two sides parallel to the base substrate 11), the base substrate 11, the drive layer 14, the first electro-conductive pattern 12, the target layer 15, the second electro-conductive pattern 13 and the packaging substrate 17 are all transparent.

Referring to FIG. 1, when the display panel 10 is a crystal display panel, the base substrate 11, the drive layer 14, the first electro-conductive pattern 12, the target layer 15 and the second electro-conductive pattern 13 are all transparent.

When the antenna pattern in the display panel is located in the display area, and the display panel transmits light from the electro-conductive pattern where the antenna pattern is located, the antenna pattern can be transparent to improve the display effect of the display panel. When the antenna pattern is located in the non-display area, or the antenna pattern is located in the display area and there is no need for the display panel to transmit light from the electro-conductive pattern where the antenna pattern is located, since the antenna pattern does not affect the display effect of the display panel, the antenna pattern can be either transparent or not transparent.

The display panel provided by the embodiment of the present application has a function of antenna, which facilitates the application of the display panel in various fields of the Internet of Things.

In summary, in the display panel according to an embodiment of the present application, at least one of the first electro-conductive pattern and the second electro-conductive pattern further includes an antenna pattern, therefore, during the process of manufacturing the display panel, after forming an electro-conductive material layer for manufacturing an electro-conductive pattern including an antenna pattern, it is possible to process the electro-conductive material layer through a patterning process so as to form an electro-conductive layer and an antenna pattern, without adopting the LDS technology to form an antenna pattern, which shortens the time for manufacturing the display apparatus and therefore improves the manufacturing efficiency of the display apparatus.

Figure 9:
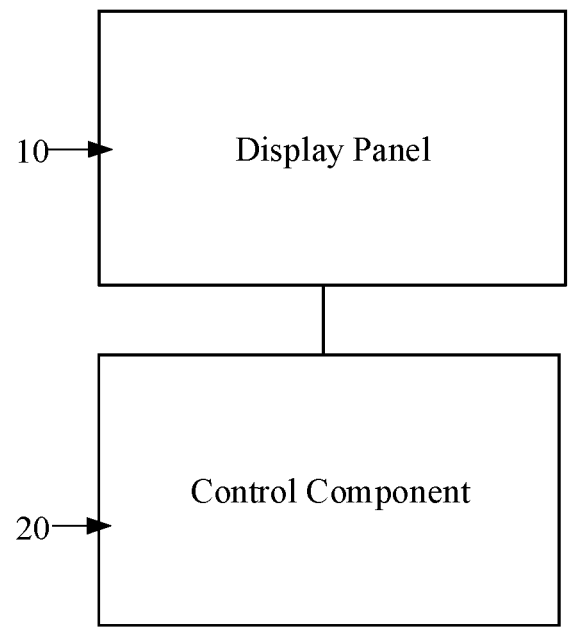
FIG. 9 is a structural diagram of a display apparatus according to an embodiment of the present application.

FIG. 9 is a structural diagram of a display apparatus according to an embodiment of the present application, the display apparatus 30 may include a control component 20 and a display panel 10, the display panel 10 can be a display panel 10 as shown in any of FIGS. 1, 7 and 8. The control component 20 is used to provide a driving signal for the display panel 10 to display an image through the first electrode layer (not shown in FIG. 8) and the second electrode layer (not shown in FIG. 8) in the display panel 10. The control component 20 is also used to control an antenna pattern (not shown in FIG. 8) to transmit a communication signal.

In summary, in the display apparatus according to an embodiment of the present application, at least one of the first electro-conductive pattern and the second electro-conductive pattern in the display panel further includes an antenna pattern, therefore, during the process of manufacturing the display panel, after forming an electro-conductive material layer for manufacturing an electro-conductive pattern including an antenna pattern, it is possible to process the electro-conductive material layer through a patterning process so as to form an electro-conductive layer and an antenna pattern, without adopting the LDS technology to form an antenna pattern, which shortens the time for manufacturing the display apparatus and therefore improves the manufacturing efficiency of the display apparatus.

In the embodiment of the present application, the control component 20 can control the display panel 10 through a plurality of control ways. Two of the plurality of control ways are described below:

In the first control way:

The control component 20 is used to provide a driving signal for the display panel 10 to display an image through the first electrode layer and the second electrode layer in the display panel 10 during a first time period. Exemplarily, when providing a driving signal for the display panel 10 to display an image through the first electrode layer, the second electrode layer and the antenna pattern in the display panel 10 during a first time period, the function of the antenna pattern is the same as that of the electrode layer in the electro-conductive pattern where the antenna pattern is located. The control component 20 is used to control the antenna pattern to transmit a communication signal during a second time period, and the first time period and the second time period are two different time periods within the display duration of one image frame. In this way, the display panel 10 can respectively display one image frame and transmit the communication signal within the display time of one image frame. That is, the transmission process of the communication signal has little effect on the continuity of the image displayed by the display panel, and the duration of the first time period and the second time period is less than the display duration of one image frame, which is therefore difficult for the human eye to detect.

Figure 10:
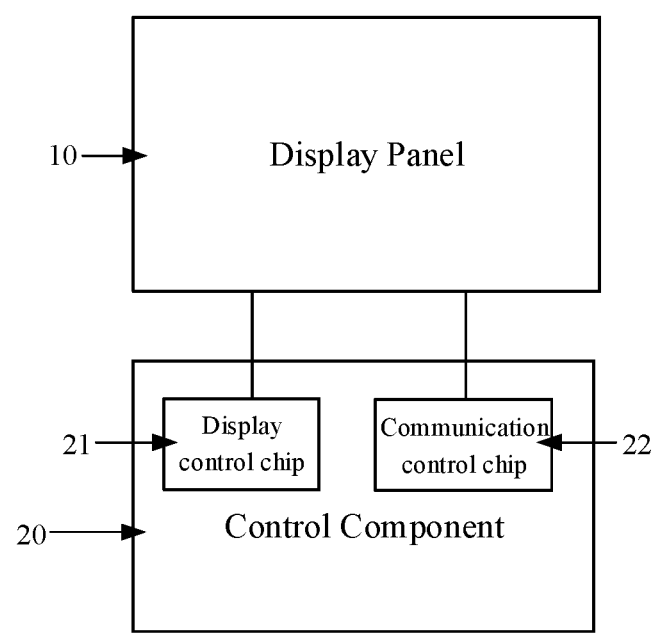
FIG. 10 is a structural diagram of another display apparatus according to an embodiment of the present application.

FIG. 10 is a structural diagram of another display apparatus according to an embodiment of the present application. The control component 20 in the display apparatus 30 can be used to be a display control chip 21 and a communication control chip 22. The display control chip 21 can be electrically connected to the first electrode layer (not shown in FIG. 10) and the second electrode layer (not shown in FIG. 10) in the display panel, respectively, and the communication control chip 22 is electrically connected to the antenna pattern; the display control chip 21 is used to provide a driving signal for the display panel 10 to display an image through the first electrode layer and the second electrode layer. The communication control chip 22 is used to control the antenna pattern to transmit a communication signal.

When the control component 20 controls the display panel 10 through the first control way, the display control chip 21 is used to provide a driving signal for the display panel 10 to display an image through the first electrode layer and the second electrode layer during a first time period, so that the display panel 10 displays an image. The communication control chip 22 is used to control the antenna pattern to transmit a communication signal during a second time period.

Optionally, the display control chip 21 is also used to receive a response signal which is for displaying a control signal and fed back by the first electrode layer and the second electrode layer, the response signal fed back by the first electrode layer and the second electrode layer can be used to respond to the display control signal of the display control chip 21. Exemplarily, the display control signal includes a driving signal, and the response signal can be used to indicate whether the driving signal is successfully loaded, or indicate other related parameters of the signal loading.

Optionally, when the antenna pattern is located in the display area, the display control chip 21 can also be electrically connected to the antenna pattern. The display control chip 21 is used to provide a driving signal for the display panel 10 to display an image through the first electrode layer, the second electrode layer and the antenna pattern during a first time period, at this moment, the function of the antenna pattern is the same as that of the electrode layer in the electro-conductive pattern where the antenna pattern is located. Exemplarily, when the display panel 10 is a color OLED display panel as shown in FIG. 7, the display control chip 21 is used to apply an anode voltage to each first electrode in the first electrode layer and apply a cathode voltage to each second electrode and each antenna pattern in the second electrode layer at the first time period, so as to provide a driving signal for the display panel 10 to display an image. Optionally, the display control chip 21 may also be used to receive a response signal fed back by the first electrode layer, the second electrode layer and the antenna pattern at the first time period.

In the second control way:

The control component is electrically connected to the first electrode layer, the second electrode layer and the antenna pattern via signal lines, and the control component detects the type of the received signal after receiving the signal transmitted by the signal lines. When the received signal is a communication signal, responding to the communication signal; when the received signal is a response signal of a display control signal, responding to the response signal.

During the process of the control component sending a signal to the display panel, the control component can apply a driving signal to the first electrode layer and the second electrode layer via the signal line, so that the display panel displays an image. The control component can also send a communication signal to the antenna pattern via the signal line, by which the antenna pattern sends the communication signal.

During the process of the control component receiving the signal sent by the display panel, the control component can receive the response signal fed back by the first electrode layer and the second electrode layer via the signal line, and the control component can also receive a communication signal sent by the antenna pattern via the signal line. The response signal fed back by the electrode layer is usually an electrical signal with a voltage range within a preset voltage range or with a current range within a preset current range, the communication signal is usually an electrical signal with a frequency range within a preset frequency range, and the voltage range, current range and frequency range of the response signal fed back by the electrode layer are all different from those of the communication signal.

After the control component receives the signal transmitted by the signal line (the signal is hereinafter referred to as a first signal), the control component can detect the type of the first signal through the following two ways.

In the first way, the control component can determine whether the voltage range of the first signal is within a preset voltage range. When the voltage range of the first signal is within the preset voltage range, it can be determined that the first signal is a response signal fed back by the electrode layer, and when the voltage range of the first signal is out of the preset voltage range, it can be determined that the first signal is a communication signal.

Alternatively, the control component can determine whether the current range of the first signal is within a preset current range. When the current range of the first signal is within the preset current range, it can be determined that the first signal is a response signal fed back by the electrode layer; and when the current range of the first signal is out of the preset current range, it can be determined that the first signal is a communication signal.

In the second way, the control component can also determine whether the frequency range of the first signal is within a preset frequency range, and when the frequency range of the first signal is within the preset frequency range, it can be determined that the first signal is a communication signal; when the frequency range of the first signal is out of the preset frequency range, it can be determined that the first signal is a response signal fed back by the electrode layer.

Figure 11:
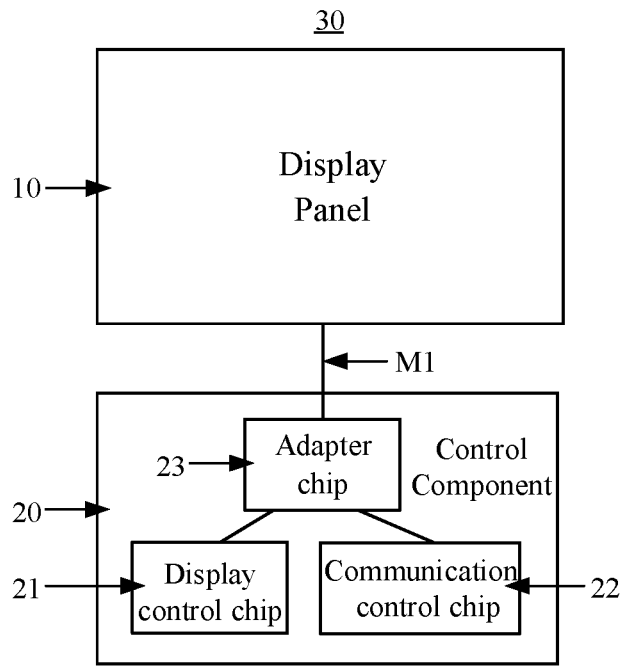
FIG. 11 is a structural diagram of a further display apparatus according to an embodiment of the present application.

FIG. 11 is a structural diagram of a further display apparatus according to an embodiment of the present application, the control component 20 in the display apparatus 30 may include a display control chip 21, a communication control chip 22 and an adapter chip 23. The adapter chip 23 is electrically connected to the display control chip 21 and the communication control chip 22, respectively, and the adapter chip 23 can be electrically connected to the first electrode layer, the second electrode layer and the antenna pattern in the display panel 10 via signal lines M1.

The adapter chip 23 is used to receive the driving signal sent by the display control chip 21, and send the driving signal to the first electrode layer and the second electrode layer via the signal line M1, so that the display panel 10 displays an image. The adapter chip 23 can also be used to receive a communication signal sent by the communication control chip 22, and send the communication signal to the antenna pattern via the signal line M1, so that the antenna pattern sends the communication signal.

The adapter chip 23 is also used to receive the first signal sent by the display panel 10 and detect the type of the first signal (the type may include a response signal and a communication signal). When the first signal is a response signal fed back by the electrode layer, the response signal is sent to the display control chip 21 so that the display control chip responds to the response signal; when the first signal is a communication signal, the communication signal is sent to the communication control chip 22 so that the communication control chip 22 responds to the communication signal.

The control component 20 can transceive a driving signal and a communication signal at the same or different time periods. Exemplarily, when the adapter chip 23 receives the driving signal and the communication signal transmitted by the signal line M1 at the same time period, the adapter chip 23 can send the driving signal to the display control chip 21, and send the communication signal to the communication control chip 22. When the adapter chip 23 simultaneously receives the driving signal sent by the display control chip 21 and the communication signal sent by the communication control chip 22, the adapter chip 23 can send the driving signal and the communication signal to the display panel via the signal line M1 at the same time period, or respectively send the driving signal and the communication signal to the display panel at different time periods.

In summary, in the display apparatus according to an embodiment of the present application, at least one of the first electro-conductive pattern and the second electro-conductive pattern in the display panel further includes an antenna pattern, therefore, during the process of manufacturing the display panel, after forming an electro-conductive material layer for manufacturing an electro-conductive pattern including an antenna pattern, it is possible to process the electro-conductive material layer through a patterning process so as to form an electro-conductive layer and an antenna pattern, without adopting the LDS technology to form an antenna pattern, which shortens the time for manufacturing the display apparatus and therefore improves the manufacturing efficiency of the display apparatus.

Figure 12:
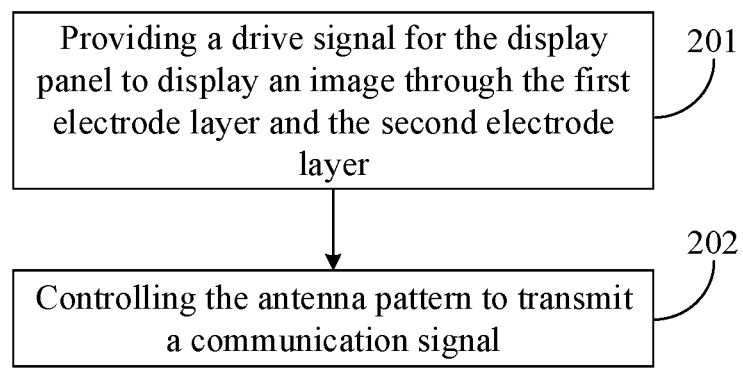
FIG. 12 is a flowchart of a control method of a display apparatus according to an embodiment of the present application.

As shown in FIG. 12, FIG. 12 is a flowchart of a control method of a display apparatus according to an embodiment of the present application, the method can be applied to the control component in the display apparatus according to an embodiment of the present application, the method includes the following steps.

In Step 201, a driving signal is provided for the display panel to display an image through the first electrode layer and the second electrode layer.

In Step 202, the antenna pattern is controlled to transmit a communication signal.

In summary, in the control method of a display apparatus according to an embodiment of the present application, the method being applied for the display panel, at least one of the first electro-conductive pattern and the second electro-conductive pattern in the display panel further includes an antenna pattern, therefore, during the process of manufacturing the display panel, after forming an electro-conductive material layer for manufacturing an electro-conductive pattern including an antenna pattern, it is possible to process the electro-conductive material layer through a one-time patterning process so as to form an electro-conductive layer and an antenna pattern, without adopting the LDS technology to form an antenna pattern, which shortens the time for manufacturing the display apparatus and therefore improves the manufacturing efficiency of the display apparatus.

Optionally, in the above Step 201:
a driving signal is provided for the display panel to display an image through the first electrode layer and the second electrode layer during a first time period.

In the above Step 202:

the antenna pattern is controlled to transmit the communication signal during a second time period, the first period and the second period being two different time periods within a display duration of one image frame.

Optionally, the control component includes a display control chip and a communication control chip, wherein the display control chip is electrically connected to the first electrode layer and the second electrode layer, respectively, the communication control chip is electrically connected to the antenna pattern. The above Step 201 includes:

1) controlling, by a display control chip, the first electrode layer and the second electrode layer to provide a driving signal for the display panel to display an image; and 2) controlling, by a communication control chip, the antenna pattern to transmit a communication signal.

Figure 13:
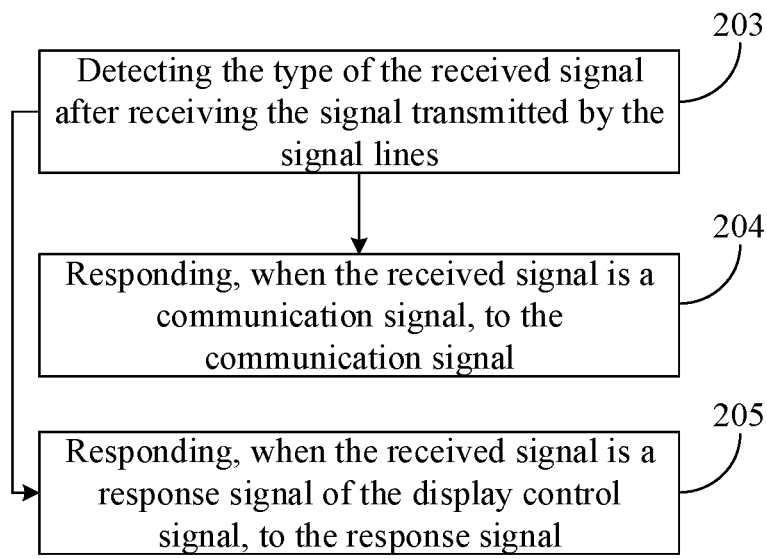
FIG. 13 is a flowchart of another control method of a display apparatus according to an embodiment of the present application.

Optionally, the control component is electrically connected to the first electrode layer, the second electrode layer and the antenna pattern via signal lines. As shown in FIG. 13, the method also includes:

In step 203, the type of the received signal is detected after receiving the signal transmitted by the signal lines;

In step 204, when the received signal is the communication signal, the communication signal is responded to; and In step 205, when the received signal is a response signal of a display control signal, the response signal is responded to.

For the content of the control method of the display apparatus, it is possible to refer to above-mentioned embodiments of the display apparatus, which will not be repeated here.

The present application provides a terminal, and the terminal may include any of the above-mentioned display apparatus. The terminal can be a terminal of various devices with the display function, such as smart phones, desktop computers, notebook computers, tablet computers, smart watches, and smart glasses.

Other embodiments of the present application will be apparent to those skilled in the art from consideration of the specification and practice of the present application. This application is intended to cover any variations, uses, or adaptations of the present application following the general principles thereof and including common knowledge or commonly used technical measures which are not disclosed herein. The specification and embodiments are to be considered as exemplary merely, and the true scope and spirit of the present application are indicated by the following claims.

It will be appreciated that the present application is not limited to the exact construction that has been described above and illustrated in the accompanying drawings, and that various modifications and changes can be made without departing from the scope thereof.

What is claimed is:

1. A display panel, comprising: a base substrate, and a first electro-conductive pattern and a second electro-conductive pattern which are arranged on the base substrate, wherein the first electro-conductive pattern and the second electro-conductive pattern are insulated from each other; and the first electro-conductive pattern comprises a first electrode layer, the second electro-conductive pattern comprises a second electrode layer, and at least one of the first electro-conductive pattern and the second electro-conductive pattern comprises an antenna pattern, the antenna pattern being insulated from the electrode layer in the first electro-conductive pattern in a case that antenna pattern is disposed in the first electro-conductive pattern and the antenna pattern being insulated from the electrode layer in the second electro-conductive pattern in a case that antenna pattern is disposed in the second electro-conductive pattern, wherein a thickness of the antenna pattern and a skin depth of the antenna pattern have a relationship of: $3D1 \geq D2 \geq 2D1$, D1 represents the skin depth of the antenna pattern, D2 represents the thickness of the antenna pattern, the skin depth of the antenna pattern is a thickness of a surface of the antenna pattern through which current flows, and the thickness of the antenna pattern is a thickness of the antenna pattern in a direction perpendicular to the base substrate;

wherein the first electrode layer and the second electrode layer are configured to provide a driving signal for the display panel to display an image, and the antenna pattern is configured to transmit a communication signal.

2. The display panel according to claim 1, wherein the base substrate has a display area, wherein the antenna pattern is within the display area.

3. The display panel according to claim 2, wherein the electrode layer in the electro-conductive pattern where the antenna pattern is located is a plate layer having a hollowed-out area, wherein the antenna pattern is in the hollowed-out area.

4. The display panel according to claim 3, wherein the display panel is an organic light emitting diode display panel, and the electrode layer in the electro-conductive pattern where the antenna pattern is located is a cathode layer.

5. The display panel according to claim 3, wherein the display panel is a liquid crystal display panel, and the electrode layer in the electro-conductive pattern where the antenna pattern is located is a common electrode layer.

6. The display panel according to claim 2, wherein a material of the antenna pattern comprises a transparent electro-conductive material.

7. The display panel according to claim 1, wherein the base substrate has a non-display area, wherein the antenna pattern is within the non-display area.

8. The display panel according to claim 1, wherein an orthographic projection of each antenna pattern on the base substrate presents a shape having edges of at least two different lengths.

9. The display panel according to claim 8, wherein a length of each of the edges is a quarter of a wavelength of a signal to be transmitted.

10. The display panel according to claim 1, wherein the electro-conductive pattern where the antenna pattern is located is formed by a one-time patterning process.

11. The display panel according to claim 1, wherein the base substrate has a non-display area, and the antenna pattern is within the non-display area;

an orthographic projection of each antenna pattern on the base substrate presents a shape having edges of at least two different lengths, and a length of each of the edges is a quarter of the wavelength of a signal to be transmitted;

the electrode layer in the electro-conductive pattern where the antenna pattern is located is a plate layer having a hollowed-out area, wherein the antenna pattern is in the hollowed-out area; and the display panel is an OLED display panel, and the electrode layer in the electro-conductive pattern where the antenna pattern is located is a cathode layer.

12. A display apparatus, comprising a control component and a display panel; wherein
the display panel comprises a base substrate, and a first electro-conductive pattern and a second electro-conductive pattern which are arranged on the base substrate, wherein the first electro-conductive pattern and the second electro-conductive pattern are insulated from each other, the first electro-conductive pattern comprises a first electrode layer, the second electro-conductive pattern comprises a second electrode layer, and at least one of the first electro-conductive pattern and the second electro-conductive pattern comprises an antenna pattern, the antenna pattern being insulated from the electrode layer in the first electro-conductive pattern in a case that antenna pattern is disposed in the first electro-conductive pattern and the antenna pattern being insulated from the electrode layer in the second electro-conductive pattern in a case that antenna pattern is disposed in the second electro-conductive pattern; and
the control component is configured to provide a driving signal for the display panel to display an image through the first electrode layer and the second electrode layer; and the control component is further configured to control the antenna pattern to transmit a communication signal;
wherein the control component is electrically connected to the first electrode layer, the second electrode layer and the antenna pattern via signal lines; and the control component is configured to detect a type of a received signal after receiving the signal transmitted by the signal lines, respond, when the received signal is the communication signal, to the communication signal, and respond, when the received signal is a response signal of a display control signal, to the response signal.

13. The display apparatus according to claim 12, wherein the control component is configured to provide the driving signal for the display panel to display the image through the first electrode layer and the second electrode layer during a first time period, and control the antenna pattern to transmit the communication signal during a second time period; and the first time period and the second time period are two different time periods within the display duration of one image frame.

14. The display apparatus according to claim 12, wherein the control component comprises a display control chip and a communication control chip, wherein the display control chip is electrically connected to the first electrode layer and the second electrode layer, respectively, and the communication control chip is electrically connected to the antenna pattern;
the display control chip is configured to provide the driving signal for the display panel to display the image through the first electrode layer and the second electrode layer; and
the communication control chip is configured to control the antenna pattern to transmit the communication signal.

15. The display apparatus according to claim 12, wherein the control component comprises: a display control chip, a communication control chip and an adapter chip, wherein the adapter chip is electrically connected to the display control chip and the communication control chip, respectively, and the adapter chip is electrically connected to the first electrode layer, the second electrode layer and the antenna pattern in the display panel via the signal lines.

16. A control method of a display apparatus, applied to a control component in the display apparatus comprising a display panel, wherein
the display panel comprises a base substrate, and a first electro-conductive pattern and a second electro-conductive pattern which are arranged on the base substrate, wherein the first electro-conductive pattern and the second electro-conductive pattern are insulated from each other, the first electro-conductive pattern comprises a first electrode layer, the second electro-conductive pattern comprises a second electrode layer, and at least one of the first electro-conductive pattern and the second electro-conductive pattern comprises an antenna pattern, the antenna pattern being insulated from the electrode layer in the first electro-conductive pattern in a case that antenna pattern is disposed in the first electro-conductive pattern and the antenna pattern being insulated from the electrode layer in the second electro-conductive pattern in a case that antenna pattern is disposed in the second electro-conductive pattern; and
the method comprises:
providing a driving signal for the display panel to display an image through the first electrode layer and the second electrode layer; and
controlling the antenna pattern to transmit a communication signal;
wherein the control component is electrically connected to the first electrode layer, the second electrode layer and the antenna pattern via signal lines, and the method further comprises:
detecting a type of a received signal after receiving the signal transmitted by the signal lines;
responding, when the received signal is the communication signal, to the communication signal; and
responding, when the received signal is a response signal of a display control signal, to the response signal.

17. The method according to claim 16, wherein providing the driving signal for the display panel to display the image through the first electrode layer and the second electrode layer comprises:
providing the driving signal for the display panel to display the image through the first electrode layer and the second electrode layer during a first time period; and
controlling the antenna pattern to transmit the communication signal comprises:
controlling the antenna pattern to transmit the communication signal during a second time period, the first time period and the second time period being two different time periods within the display duration of one image frame.

18. The method according to claim 16, wherein the control component comprises a display control chip and a communication control chip, wherein the display control chip is electrically connected to the first electrode layer and the second electrode layer, respectively, the communication control chip is electrically connected to the antenna pattern, and providing the driving signal for the display panel to display the image through the first electrode layer and the second electrode layer comprises:
controlling, by the display control chip, the first electrode layer and the second electrode layer to provide the driving signal for the display panel to display the image; and controlling, by the communication control chip, the antenna pattern to transmit the communication signal.

\* \* \* \* \*